United States Patent
Choi

(10) Patent No.: US 10,026,461 B2
(45) Date of Patent: *Jul. 17, 2018

(54) SEMICONDUCTOR DEVICES AND SEMICONDUCTOR SYSTEMS INCLUDING THE SAME

(71) Applicant: SK hynix Inc., Icheon-si, Gyeonggi-do (KR)

(72) Inventor: Geun Ho Choi, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 145 days.

This patent is subject to a terminal disclaimer.

(21) Appl. No.: 15/159,369

(22) Filed: May 19, 2016

(65) Prior Publication Data
US 2017/0200485 A1    Jul. 13, 2017

(30) Foreign Application Priority Data

Jan. 11, 2016  (KR) .................... 10-2016-0003427

(51) Int. Cl.
*G11C 7/10*  (2006.01)
*G11C 7/22*  (2006.01)
*G11C 7/12*  (2006.01)

(52) U.S. Cl.
CPC ............ *G11C 7/222* (2013.01); *G11C 7/1057* (2013.01); *G11C 7/12* (2013.01)

(58) Field of Classification Search
CPC .......... G11C 7/222; G11C 7/12; G11C 7/1057
See application file for complete search history.

(56) References Cited

U.S. PATENT DOCUMENTS

| 2004/0268016 | A1* | 12/2004 | Lee ...................... G11C 7/1066 711/1 |
| 2005/0111273 | A1* | 5/2005 | Seo ...................... G11C 7/1051 365/202 |
| 2014/0355367 | A1 | 12/2014 | Gay |
| 2014/0361821 | A1 | 12/2014 | Connell et al. |
| 2015/0124539 | A1 | 5/2015 | Iijima |
| 2015/0256183 | A1* | 9/2015 | Park ...................... G11C 7/222 327/115 |
| 2015/0364163 | A1 | 12/2015 | Song et al. |

FOREIGN PATENT DOCUMENTS

| KR | 100673678 B1 | 1/2007 |
| KR | 1020110002302 A | 1/2011 |
| KR | 1020150025887 A | 3/2015 |

* cited by examiner

*Primary Examiner* — Mohammed A Bashar
(74) *Attorney, Agent, or Firm* — William Park & Associates Ltd.

(57) ABSTRACT

A semiconductor device may include a strobe signal buffer, a strobe signal division circuit, and a drive control circuit. The strobe signal buffer may buffer a first data strobe signal and a second data strobe signal to generate a buffer output signal and an inverted buffer output signal. The strobe signal division circuit may divide the buffer output signal and the inverted buffer output signal to generate internal strobe signals which are used in capturing data when receiving data. The drive control circuit may drive the buffer output signal to a predetermined logic level during an initial section of time from a point of time when a write operation is performed.

29 Claims, 12 Drawing Sheets

SEMICONDUCTOR DEVICES AND SEMICONDUCTOR SYSTEMS INCLUDING THE SAME

CROSS-REFERENCE TO RELATED APPLICATIONS

The present application claims priority under 35 U.S.C 119(a) to Korean Patent Application No. 10-2016-0003427 filed on Jan. 11, 2016, which is incorporated herein by reference in its entirety.

BACKGROUND

1. Technical Field

Embodiments of the present disclosure relate to semiconductor devices generating internal strobe signals and semiconductor systems including the same.

2. Related Art

Semiconductor systems including semiconductor devices may generate internal strobe signals from data strobe signals generated outside the semiconductor devices to operate at a high speed. The internal strobe signals may be set to have different phases from each other and may be used in input/output operations of data. For example, the semiconductor devices may generate four internal strobe signals between which a phase difference of 90 degrees exists and may receive or output the data using the four internal strobe signals. In such a case, the semiconductor devices may operate at a higher speed than other semiconductor devices that receive or output the data using the data strobe signals.

SUMMARY

According to an embodiment, a semiconductor device may include a strobe signal buffer, a strobe signal division circuit and a drive control circuit. The strobe signal buffer may buffer a first data strobe signal and a second data strobe signal to generate a buffer output signal and an inverted buffer output signal. The strobe signal division circuit may divide the buffer output signal and the inverted buffer output signal to generate internal strobe signals which are used in capturing data when receiving data. The drive control circuit drives the buffer output signal to a predetermined logic level during an initial section of time from a point of time when a write operation is performed.

According to an embodiment, a semiconductor system may include a first semiconductor device and a second semiconductor device. The first semiconductor device may output a command signal, a first clock signal, a second clock signal, a first data strobe signal, a second data strobe signal, and a data signal. The second semiconductor device may buffer the first data strobe signal and the second data strobe signal to generate a buffer output signal and an inverted buffer output signal. In addition, the second semiconductor device may divide the buffer output signal and the inverted buffer output signal to generate internal strobe signals which are used in capturing data when receiving data. The buffer output signal is driven to a predetermined logic level in response to the command signal during an initial section of time from a point of time when a write operation starts.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
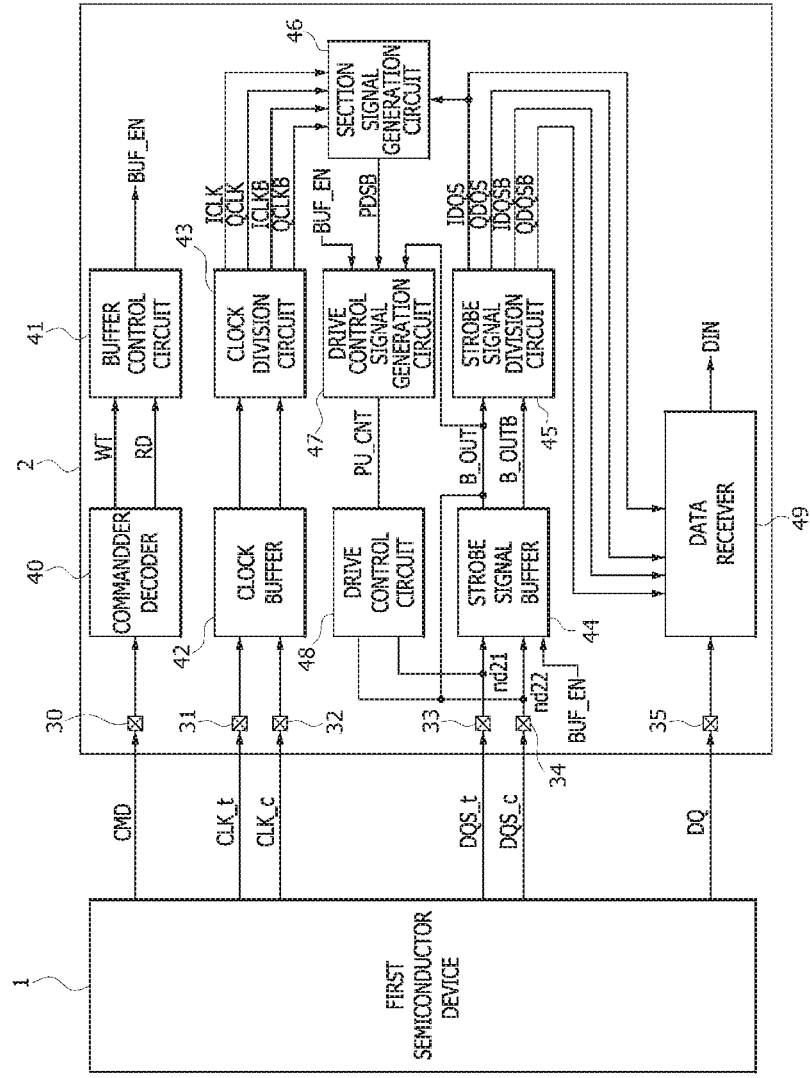
FIG. 1 is a diagram illustrating an example configuration of a semiconductor system according to an embodiment of the present disclosure.

As illustrated in FIG. 1, a semiconductor system according to an embodiment of the present disclosure may include a first semiconductor device 1 and a second semiconductor device 2.

The first semiconductor device 1 may apply an external command signal CMD, a first clock signal CLK_t, a second clock signal CLK_c, a first data strobe signal DQS_t, a second data strobe signal DQS_c, and a data signal DQ to the second semiconductor device 2. The first data strobe signal DQS_t and the second data strobe signal DQS_c may toggle during a section of time from a point of time when a predetermined section of time (e.g., a write latency) elapses after a moment when a write operation starts till a point of time when the write operation terminates. Here, data strobe signals may be signals that can be used in capturing data when receiving data.

The second semiconductor device 2 may include a first pad 30, a second pad 31, a third pad 32, a fourth pad 33, a fifth pad 34, a sixth pad 35, a command decoder 40, a buffer control circuit 41, a clock buffer 42, a clock division circuit 43, a strobe signal buffer 44, a strobe signal division circuit 45, a section signal generation circuit 46, a drive control signal generation circuit 47, a drive control circuit 48, and a data receiver 49.

The command decoder 40 may receive the command signal CMD through the first pad 30 and may decode the command signal CMD to generate a write command signal WT and a read command signal RD. The write command signal WT may be enabled for a write operation, and the read command signal RD may be enabled for a read operation. The command signal CMD may include multiple bits, and a logic level combination of the multiple bits included in the command signal CMD for enabling the write command signal WT or the read command signal RD may be set to be different according to embodiments.

The buffer control circuit 41 may generate a buffer enablement signal BUF_EN in response to the write command signal WT and the read command signal RD. The buffer control circuit 41 may generate the buffer enablement signal BUF_EN, which is enabled if the write command signal WT is enabled for a write operation and is disabled if the read command signal RD is enabled for a read operation. The buffer control circuit 41 may generate the buffer enablement signal BUF_EN, which is enabled during the write operation and is disabled during the read operation.

The clock buffer 42 may receive the first clock signal CLK_t and the second clock signal CLK_c through the second pad 31 and the third pad 32 and may buffer the first clock signal CLK_t and the second clock signal CLK_c to output the buffered first and second clock signals.

The clock division circuit 43 may receive the first clock signal CLK_t and the second clock signal CLK_c which are buffered by the clock buffer 42 and may divide the buffered first clock signal CLK_t and the buffered second clock signal CLK_c to generate a first internal clock signal ICLK, a second internal clock signal QCLK, a third internal clock signal ICLKB, and a fourth internal clock signal QCLKB. The first internal clock signal ICLK, the second internal clock signal QCLK, the third internal clock signal ICLKB, and the fourth internal clock signal QCLKB may have a cycle time that is twice a cycle time of the first clock signal CLK_t and the second clock signal CLK_c. The first internal clock signal ICLK, the second internal clock signal QCLK, the third internal clock signal ICLKB, and the fourth internal clock signal QCLKB may have a 90-degree phase increments/decrements. For example, the first and second internal clock signals ICLK and QCLK may have a 90-degree phase difference, and the second and third internal clock signals QCLK and ICLKB may have a 90-degree phase difference, and the third and fourth internal clock signals ICLKB and QCLKB may have a 90-degree phase difference. The first internal clock signal ICLK and the third internal clock signal ICLKB may have different phases which are opposite to each other, and the second internal clock signal QCLK and the fourth internal clock signal QCLKB may have different phases which are opposite to each other.

The strobe signal buffer 44 may receive the first data strobe signal DQS_t and the second data strobe signal DQS_c through the fourth pad 33 and the fifth pad 34 in response to the buffer enablement signal BUF_EN. More specifically, the strobe signal buffer 44 may buffer the first data strobe signal DQS_t and the second data strobe signal DQS_c while the buffer enablement signal BUF_EN is enabled, thereby outputting a buffer output signal B_OUT and an inverted buffer output signal B_OUTB.

The strobe signal division circuit 45 may divide the buffer output signal B_OUT and the inverted buffer output signal B_OUTB to generate a first internal strobe signal IDQS, a second internal strobe signal QDQS, a third internal strobe signal IDQSB, and a fourth internal strobe signal QDQSB. The first internal strobe signal IDQS, the second internal strobe signal QDQS, the third internal strobe signal IDQSB, and the fourth internal strobe signal QDQSB may have a cycle time that is twice a cycle time of the first data strobe signal DQS_t and the second data strobe signal DQS_c. The first internal strobe signal IDQS, the second internal strobe signal QDQS, the third internal strobe signal IDQSB, and the fourth internal strobe signal QDQSB may be set to have a 90-degree phase increments/decrements. For example, the first and second internal strobe signals IDLK and QDLK may have a 90-degree phase difference, and the second and third internal strobe signals QDLK and IDLKB may have a 90-degree phase difference, and the third and fourth internal strobe signals IDLKB and QDLKB may have a 90-degree phase difference. The first internal strobe signal IDQS and the third internal strobe signal IDQSB have opposite phases (e.g., a 180-degree phase difference), and the second internal strobe signal QDQS and the fourth internal strobe signal QDQSB may have opposite phases (e.g., a 180-degree phase difference).

The section signal generation circuit 46 may generate a section signal PDSB in response to the first internal strobe signal IDQS, the first internal clock signal ICLK, the second internal clock signal QCLK, the third internal clock signal ICLKB, and the fourth internal clock signal QCLKB. For example, the section signal generation circuit 46 may store the first internal clock signal ICLK, the second internal clock signal QCLK, the third internal clock signal ICLKB, and the fourth internal clock signal QCLKB in synchronization with the first internal strobe signal IDQS to generate the section signal PDSB which is enabled during a section of time when the first data strobe signal DQS_t and the second data strobe signal DQS_c do not toggle. In some embodiments, the section signal generation circuit 46 may be realized to store the first internal clock signal ICLK, the second internal clock signal QCLK, the third internal clock signal ICLKB, and the fourth internal clock signal QCLKB in synchronization with at least one of the first internal strobe signal IDQS, the second internal strobe signal QDQS, the third internal strobe signal IDQSB, and the fourth internal strobe signal QDQSB.

The drive control signal generation circuit 47 may generate a drive control signal PU_CNT in response to the buffer enablement signal BUF_EN, the section signal PDSB, and the buffer output signal B_OUT. The drive control signal generation circuit 47 may generate the drive control signal PU_CNT which is enabled during a predetermined initial section of time in synchronization with a point of time when the buffer enablement signal BUF_EN is enabled. The drive control signal generation circuit 47 may generate the drive control signal PU_CNT, which is disabled in response to the buffer output signal B_OUT and is enabled while the section signal PDSB is enabled.

The drive control circuit 48 may drive a node nd21 coupled to the fourth pad 33 and a node nd22 coupled to the fifth pad 34 to a predetermined logic level in response to the drive control signal PU_CNT. Here, the node nd22 may determine a logic level of the buffer output signal B_OUT. For example, the drive control circuit 48 may drive the node nd21 to a logic high level if the drive control signal PU_CNT is enabled. As a result, for example, the drive control circuit 48 may shift a logic level of the buffer output signal B_OUT to the logic high level. The drive control circuit 48 may drive the node nd22 to a logic low level.

The data receiver 49 may receive the data signal DQ through the sixth pad 35 and may store the data signal DQ in synchronization with the first internal strobe signal IDQS, the second internal strobe signal QDQS, the third internal strobe signal IDQSB, and the fourth internal strobe signal QDQSB to generate an internal data signal DIN.

Figure 2:
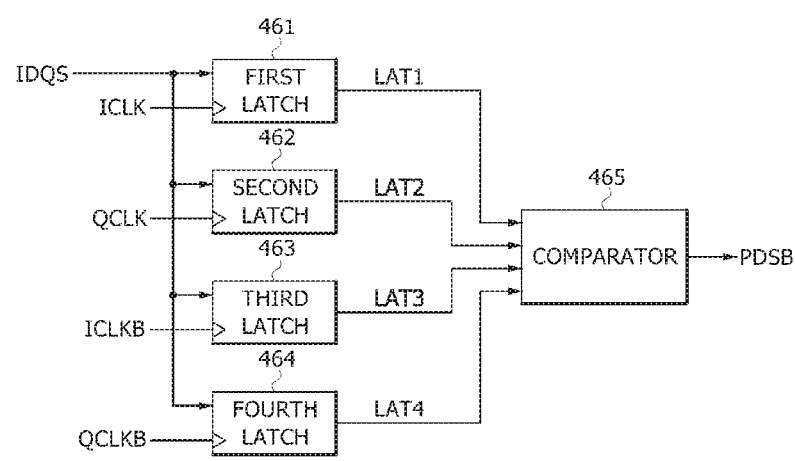
FIG. 2 is a diagram of an example of a section signal generation circuit included in the semiconductor system of FIG. 1.

Referring to FIG. 2, the section signal generation circuit 46 may include a first storage circuit 461, a second storage circuit 462, a third storage circuit 463, a fourth storage circuit 464, and a comparator 465.

The first storage circuit 461 may store the first internal strobe signal IDQS to generate a first storage circuit output signal LAT1 in synchronization with the first internal clock signal ICLK. For example, the first storage circuit 461 may store the first internal strobe signal IDQS to output the stored signal as the first storage circuit output signal LAT1 in synchronization with a point of time when the first internal clock signal ICLK is changed from a logic low level into a logic high level (hereinafter referred to as a "rising edge").

The second storage circuit 462 may store the first internal strobe signal IDQS to generate a second storage circuit output signal LAT2 in synchronization with the second internal clock signal QCLK. For example, the second storage circuit 462 may store the first internal strobe signal IDQS to output the stored signal as the second storage circuit output signal LAT2 in synchronization with a rising edge of the second internal clock signal QCLK.

The third storage circuit 463 may store the first internal strobe signal IDQS to generate a third storage circuit output signal LAT3 in synchronization with the third internal clock signal ICLKB. More specifically, the third storage circuit 463 may store the first internal strobe signal IDQS to output the stored signal as the third storage circuit output signal LAT3 in synchronization with a rising edge of the third internal clock signal ICLKB.

The fourth storage circuit 464 may store the first internal strobe signal IDQS to generate a fourth storage circuit output signal LAT4 in synchronization with the fourth internal clock signal QCLKB. More specifically, the fourth storage circuit 464 may store the first internal strobe signal IDQS to output the stored signal as the fourth storage circuit output signal LAT4 in synchronization with a rising edge of the fourth internal clock signal QCLKB.

The comparator 465 may generate the section signal PDSB in response to the first storage circuit output signal LAT1, the second storage circuit output signal LAT2, the third storage circuit output signal LAT3, and the fourth storage circuit output signal LAT4. The comparator 465 may generate the section signal PDSB enabled to have a logic low level if the first storage circuit output signal LAT1, the second storage circuit output signal LAT2, the third storage circuit output signal LAT3, and the fourth storage circuit output signal LAT4 have the same logic level. The comparator 465 may generate the section signal PDSB disabled to have a logic high level if the first storage circuit output signal LAT1, the second storage circuit output signal LAT2, the third storage circuit output signal LAT3, and the fourth storage circuit output signal LAT4 do not have the same logic level as one another.

Figure 3:
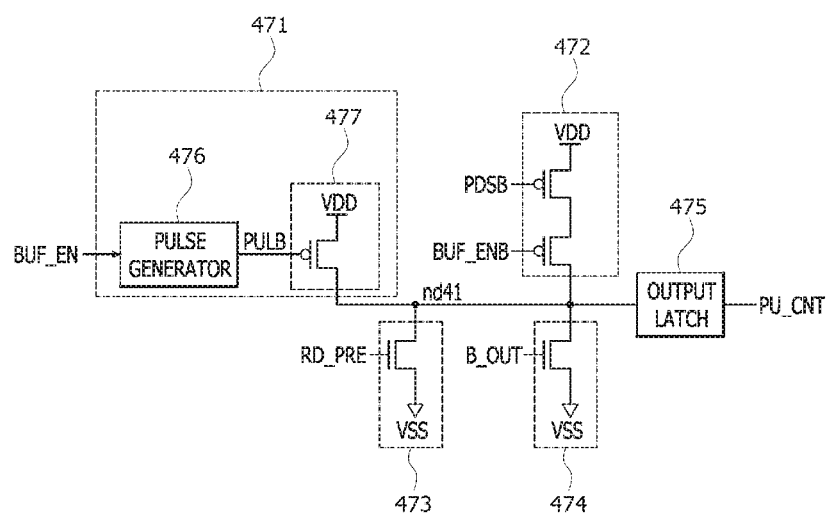
FIG. 3 is a diagram illustrating an example of a drive control signal generation circuit included in the semiconductor system of FIG. 1.

Referring to FIG. 3, the drive control signal generation circuit 47 may include a first drive circuit 471, a second drive circuit 472, a third drive circuit 473, a fourth drive circuit 474, and an output latch 475.

The first drive circuit 471 may include a pulse generator 476 and a pull-up element 477. The pulse generator 476 may generate a pulse signal PULB including a logic-low-level pulse generated in synchronization with a point of time when the buffer enablement signal BUF_EN is enabled. The pull-up element 477 may drive a node nd41 to a logic high level corresponding to a level of a power supply voltage VDD during a period when the pulse signal PULB is at a logic low level. The first drive circuit 471 may drive the node nd41 to a logic high level corresponding to the power supply voltage VDD during a period when the pulse signal PULB is at a logic low level after a point of time when a write operation starts.

The second drive circuit 472 may drive the node nd41 in response to the section signal PDSB and an inverted buffer enablement signal BUF_ENB. The inverted buffer enablement signal BUF_ENB may be generated by inverting the buffer enablement signal BUF_EN and may be enabled to have a logic low level while the buffer enablement signal BUF_EN is enabled to have a logic high level. The second drive circuit 472 may drive the node nd41 to a logic high level corresponding to the power supply voltage VDD if the section signal PDSB is enabled to have a logic low level while the inverted buffer enablement signal BUF_ENB is enabled to have a logic low level.

The third drive circuit 473 may drive the node nd41 in response to a pre-read signal RD_PRE. The pre-read signal RD_PRE may be enabled to have a logic high level if a read operation is performed. The pre-read signal RD_PRE may be set to be enabled earlier than the read command signal RD by a predetermined section of time. In some embodiments, the third drive circuit 473 may be realized to drive the node nd41 in response to the read command signal RD. The third drive circuit 473 may drive the node nd41 to a logic low level corresponding to a ground voltage VSS if the pre-read signal RD_PRE is enabled to have a logic high level.

The fourth drive circuit 474 may drive the node nd41 in response to the buffer output signal B_OUT. The fourth drive circuit 474 may drive the node nd41 to a logic low level corresponding to the ground voltage VSS if the buffer output signal B_OUT is enabled to have a logic high level.

The output latch 475 may latch a signal of the node nd41 to output the latched signal as the drive control signal PU_CNT. The drive control signal PU_CNT may maintain a certain logic level set by the output latch 475 while the node nd41 is not driven by at least one of the first drive circuit 471, the second drive circuit 472, the third drive circuit 473, and the fourth drive circuit 474.

The drive control signal generation circuit 47 in accordance with an embodiment may generate the drive control signal PU_CNT which is driven to a logic high level by the first drive circuit 471 during a period when the pulse signal PULB is at a logic low level after a point of time when the buffer enablement signal BUF_EN is enabled by a write operation. Since the buffer output signal B_OUT is enabled to have a logic high level by the drive control signal PU_CNT having a logic high level, the drive control signal generation circuit 47 may generate the drive control signal PU_CNT driven to a logic low level by the fourth drive circuit 474. Thereafter, if the write operation terminates, the section signal PDSB is enabled to have a logic low level because the first data strobe signal DQS_t and the second data strobe signal DQS_c do not toggle. Accordingly, the drive control signal generation circuit 47 may generate the drive control signal PU_CNT driven to a logic high level by the second drive circuit 472. In summary, the drive control signal generation circuit 47 may generate the drive control signal PU_CNT which is driven to a logic high level during a predetermined initial section of time after a point of time when the write operation starts and during a section of time when the section signal PDSB is enabled to have a logic low level after the write operation terminates.

Figure 4:
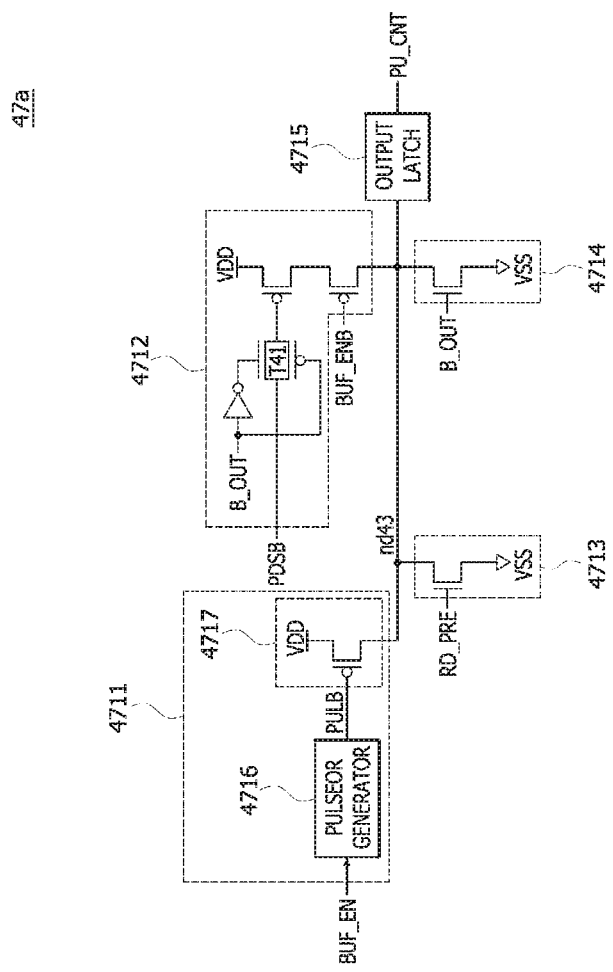
FIG. 4 is a diagram illustrating an example of the drive control signal generation circuit included in the semiconductor system of FIG. 1.

Referring to FIG. 4, a drive control signal generation circuit 47a may include a first drive circuit 4711, a second drive circuit 4712, a third drive circuit 4713, a fourth drive circuit 4714, and an output latch 4715.

The first drive circuit 4711 may include a pulse generator 4716 and a pull-up element 4717. The pulse generator 4716 may generate a pulse signal PULB including a logic-low-level pulse generated in synchronization with a point of time when the buffer enablement signal BUF_EN is enabled. The pull-up element 4717 may drive a node nd43 to a logic high level corresponding to a level of a power supply voltage VDD during a period when the pulse signal PULB is at a logic low level. The first drive circuit 4711 may drive the node nd43 to a logic high level corresponding to a level of the power supply voltage VDD during a period when the pulse signal PULB is at a logic low level after a point of time when a write operation starts.

The second drive circuit 4712 may drive the node nd43 in response to the buffer output signal B_OUT, the section signal PDSB, and an inverted buffer enablement signal BUF_ENB. The second drive circuit 4712 may include a transfer gate T41 which is turned on if the buffer output signal B_OUT is disabled to have a logic low level. The inverted buffer enablement signal BUF_ENB may be generated by inverting the buffer enablement signal BUF_EN and may be enabled to have a logic low level while the buffer enablement signal BUF_EN is enabled to have a logic high level. The second drive circuit 4712 may drive the node nd43 to a logic high level corresponding to the power supply voltage VDD if the section signal PDSB is enabled to have a logic low level while the inverted buffer enablement signal BUF_ENB is enabled to have a logic low level and the buffer output signal B_OUT is disabled to have a logic low level.

The third drive circuit 4713 may drive the node nd43 in response to a pre-read signal RD_PRE. The pre-read signal RD_PRE may be enabled to have a logic high level if a read operation is performed. The pre-read signal RD_PRE may be set to be enabled earlier than the read command signal RD by a predetermined section of time. In some embodiments, the third drive circuit 4713 may be realized to drive the node nd43 in response to the read command signal RD. The third drive circuit 4713 may drive the node nd43 to a logic low level corresponding to a level of a ground voltage VSS, if the pre-read signal RD_PRE is enabled to have a logic high level.

The fourth drive circuit 4714 may drive the node nd43 in response to the buffer output signal B_OUT. The fourth drive circuit 4714 may drive the node nd43 to a logic low level corresponding to the ground voltage VSS if the buffer output signal B_OUT is enabled to have a logic high level.

The output latch 4715 may latch a signal of the node nd43 to output the latched signal as the drive control signal PU_CNT. The drive control signal PU_CNT may maintain a certain logic level set by the output latch 4715 while the node nd41 is not driven by at least one of the first drive circuit 4711, the second drive circuit 4712, the third drive circuit 4713, and the fourth drive circuit 4714.

The drive control signal generation circuit 47*a* in accordance with an embodiment may generate the drive control signal PU_CNT which is driven to a logic high level by the first drive circuit 4711 during a period when the pulse signal PULB is at a logic low level after a point of time when the buffer enablement signal BUF_EN is enabled by a write operation. Since the buffer output signal B_OUT is enabled to have a logic high level by the drive control signal PU_CNT having a logic high level, the drive control signal generation circuit 47*a* may generate the drive control signal PU_CNT driven to a logic low level by the fourth drive circuit 4714. Thereafter, if the write operation terminates, the section signal PDSB is enabled to have a logic low level because the first data strobe signal DQS_t and the second data strobe signal DQS_c do not toggle. Accordingly, the drive control signal generation circuit 47*a* may generate the drive control signal PU_CNT driven to a logic high level by the second drive circuit 4712. In summary, the drive control signal generation circuit 47*a* may generate the drive control signal PU_CNT which is driven to a logic high level during a predetermined initial section of time after a point of time when the write operation starts and during a section of time when the section signal PDSB is enabled to have a logic low level after the write operation terminates.

Figure 5:
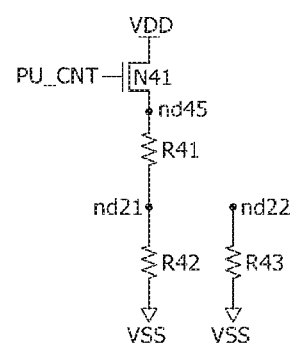
FIG. 5 is a diagram illustrating an example of a drive control circuit included in the semiconductor system of FIG. 1.

Referring to FIG. 5, the drive control circuit 48 may include an NMOS transistor N41 and resistive elements R41, R42 and R43. The NMOS transistor N41 may be coupled between the power supply voltage VDD terminal and a node nd45 and may be turned on in response to the drive control signal PU_CNT. The resistive element R41 may be coupled between the node nd21 and the node nd45, the resistive element R42 may be coupled between the node nd21 and the ground voltage VSS terminal, and the resistive element R43 may be coupled between the node nd22 and the ground voltage VSS. The drive control circuit 48 may drive the node nd22 to a logic low level corresponding to the ground voltage VSS. The drive control circuit 48 may drive the node nd21 to a logic high level corresponding to the power supply voltage VDD if the drive control signal PU_CNT is enabled to have a logic high level. The drive control circuit 48 may drive the node nd21 to a logic low level corresponding to the ground voltage VSS if the drive control signal PU_CNT is disabled to have a logic low level.

The write operation performed by the semiconductor system in accordance with an embodiment will be described hereinafter with reference to FIG. 6 to FIG. 8.

Figure 6:
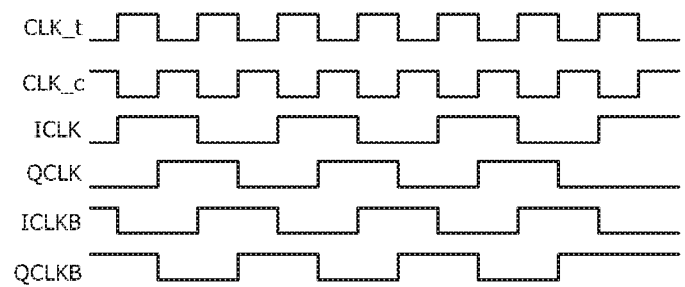
FIGS. 6 to 8 are timing diagrams illustrating an example operation of the semiconductor system shown in FIGS. 1 to 5.

Referring to FIG. 6, waveforms of the first internal clock signal ICLK, the second internal clock signal QCLK, the third internal clock signal ICLKB, and the fourth internal clock signal QCLKB which are generated by dividing the first clock signal CLK_t and the second clock signal CLK_c may be provided. The first internal clock signal ICLK, the second internal clock signal QCLK, the third internal clock signal ICLKB, and the fourth internal clock signal QCLKB may be generated to have a cycle time that is twice a cycle time of the first clock signal CLK_t and the second clock signal CLK_c. The first internal clock signal ICLK, the second internal clock signal QCLK, the third internal clock signal ICLKB, and the fourth internal clock signal QCLKB may have a 90-degree phase increments/decrements. For example, the first and second internal clock signals ICLK and QCLK may have a 90-degree phase difference, and the second and third internal clock signals QCLK and ICLKB may have a 90-degree phase difference, and the third and fourth internal clock signals ICLKB and QCLKB may have a 90-degree phase difference. The first internal clock signal ICLK and the third internal clock signal ICLKB may have opposite phases (e.g., a 180-degree phase difference), and the second internal clock signal QCLK and the fourth internal clock signal QCLKB may have opposite phases (e.g., a 180-degree phase difference).

Figure 7:
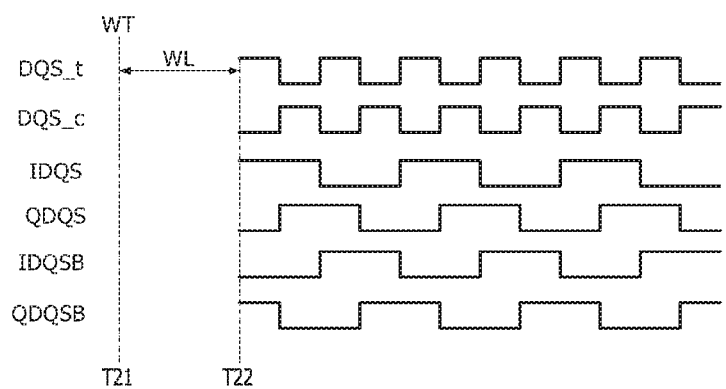

Referring to FIG. 7, waveforms of the first internal strobe signal IDQS, the second internal strobe signal QDQS, the third internal strobe signal IDQSB, and the fourth internal strobe signal QDQSB which are generated from the first data strobe signal DQS_t and the second data strobe signal DQS_c may be provided. The first internal strobe signal IDQS, the second internal strobe signal QDQS, the third internal strobe signal IDQSB, and the fourth internal strobe signal QDQSB may be generated from the first data strobe signal DQS_t and the second data strobe signal DQS_c after a point of time T22 when a write latency WL elapses from a point of time T21 when a write operation starts. Since the first data strobe signal DQS_t and the second data strobe signal DQS_c may toggle to have opposite phases from the point of time T22, the first internal strobe signal IDQS, the second internal strobe signal QDQS, the third internal strobe signal IDQSB, and the fourth internal strobe signal QDQSB may also toggle from the point in time T22 such that the first and second internal strobe signals IDQS and QDQS have a 90-degree phase difference, the second and third internal strobe signals QDQS and IDQSB have a 90-degree phase difference, and the third and fourth internal strobe signals IDQSB and QDQSB have a 90-degree phase difference.

If the write operation starts, the buffer output signal B_OUT may be driven to a logic high level during a predetermined initial section of time by the buffer enablement signal BUF_EN enabled. After the predetermined initial section of time terminates, an operation for driving the buffer output signal B_OUT to a logic high level may terminate. Thereafter, if the write operation terminates, the buffer output signal B_OUT may be driven to a logic high level again by the section signal PDSB enabled to have a logic low level.

Figure 8:
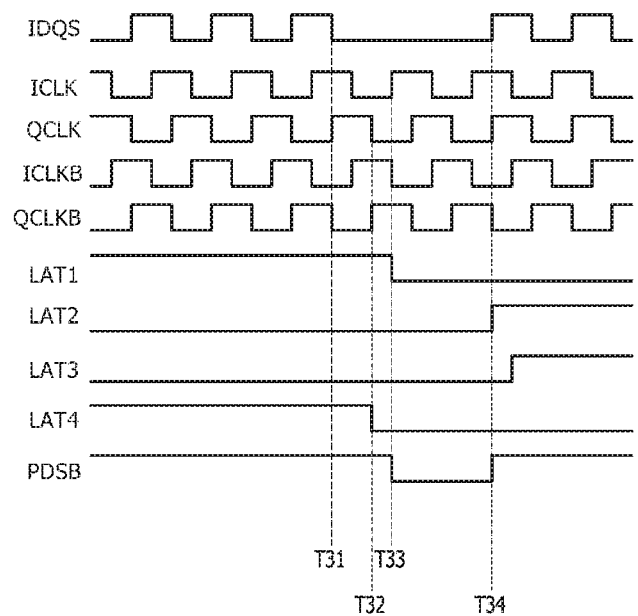

Referring to FIG. 8, after the write operation terminates, a section of time in which the section signal PDSB is enabled to have a logic low level may be provided. That is, if toggling of the first internal strobe signal IDQS terminates at a point of time T31 after the write operation, a level of the fourth storage circuit output signal LAT4 may be changed from a logic high level into a logic low level at a point of time T32 and a level of the first storage circuit output signal LAT1 is changed from a logic high level into a logic low level at a point of time T33. Hence, after the point of time T33, all of the first to fourth storage circuit output signals LAT1, LAT2, LAT3 and LAT4 may have the same logic level (i.e., a logic low level) to enable the section signal PDSB to have a logic low level. Thereafter, if the write operation starts, toggling of the first internal strobe signal IDQS may start at a point of time T34 to change a level of the second storage circuit output signal LAT2 from a logic low level into a logic high level. Accordingly, the section signal PDSB may be disabled to have a logic high level at the point of time T34.

In summary, the semiconductor system according to an embodiment may drive the buffer output signal B_OUT to a logic high level during the initial section of time from a point of time when the write operation starts in order not to generate the first to fourth internal strobe signals IDQS, QDQS, IDQSB and QDQSB that are abnormal due to the first and second data strobe signals DQS_t and DQS_c that do not toggle. If the buffer output signal B_OUT is continuously driven to a logic high level while the write operation is performed, the first internal strobe signal IDQS, the second internal strobe signal QDQS, the third internal strobe signal IDQSB, and the fourth internal strobe signal QDQSB may not be normally generated by the first data strobe signal DQS_t and the second data strobe signal DQS_c. In such a case, a data input and output section of time may be reduced. Hence, the semiconductor system according to an embodiment may prevent a data input and output section of time from being reduced by terminating a driving of the buffer output signal B_OUT to a logic high level while the write operation is performed after a termination of the initial section of time. In addition, if the write operation terminates, the semiconductor system according to an embodiment may drive the buffer output signal B_OUT to a logic high level to set a state that the first data strobe signal DQS_t and the second data strobe signal DQS_c are stably inputted. In a read operation, an operation of generating the first to fourth internal strobe signals IDQS, QDQS, IDQSB and QDQSB from the first data strobe signal DQS_t and the second data strobe signal DQS_c may not be required. Thus, the semiconductor system according to an embodiment may terminate the driving of the buffer output signal B_OUT in order to reduce current consumption while the read operation is performed.

Figure 9:
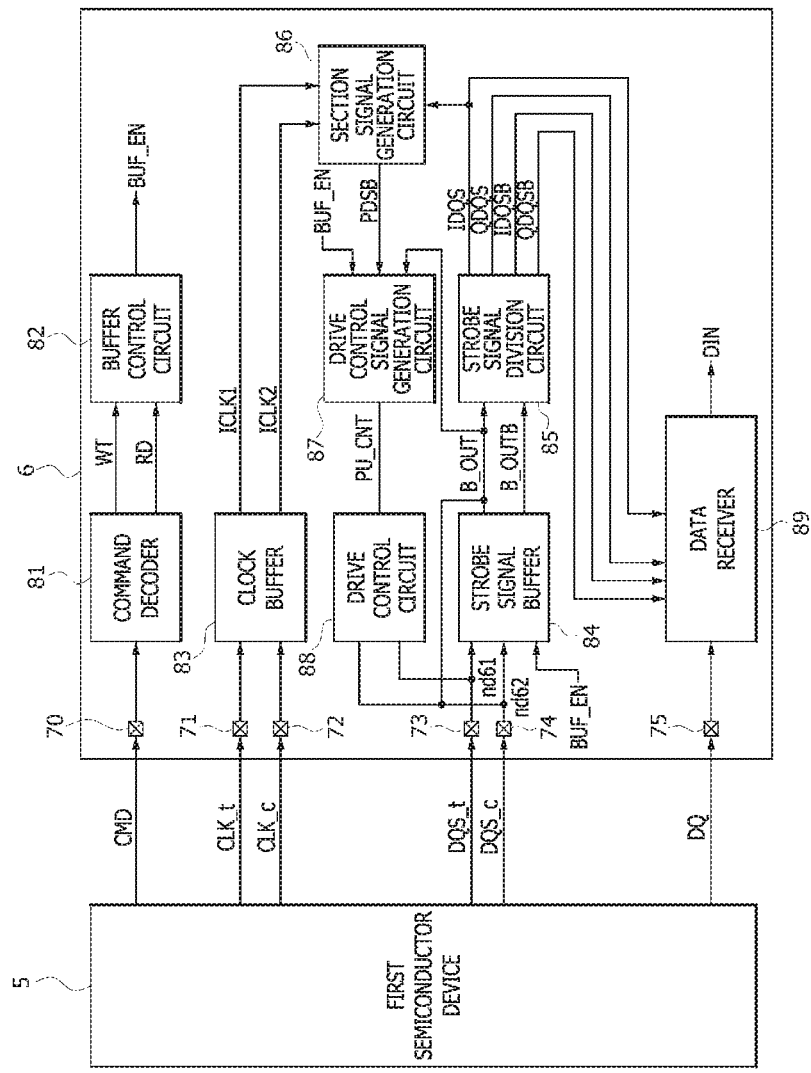
FIG. 9 is a diagram illustrating an example configuration of a semiconductor system according to another embodiment of the present disclosure.

As illustrated in FIG. 9, a semiconductor system according to another embodiment of the present disclosure may include a first semiconductor device 5 and a second semiconductor device 6.

The first semiconductor device 5 may apply an external command signal CMD, a first clock signal CLK_t, a second clock signal CLK_c, a first data strobe signal DQS_t, a second data strobe signal DQS_c, and a data signal DQ to the second semiconductor device 6. The first data strobe signal DQS_t and the second data strobe signal DQS_c may toggle during a section of time from a point of time when a predetermined section (e.g., a write latency) elapses after a moment when a write operation starts till a point of time when the write operation terminates.

The second semiconductor device 6 may include a first pad 70, a second pad 71, a third pad 72, a fourth pad 73, a fifth pad 74, a sixth pad 75, a command decoder 81, a buffer control circuit 82, a clock buffer 83, a strobe signal buffer 84, a strobe signal division circuit 85, a section signal generation circuit 86, a drive control signal generation circuit 87, a drive control circuit 88, and a data receiver 89.

The command decoder 81 may receive the command signal CMD through the first pad 70 and may decode the command signal CMD to generate a write command signal WT and a read command signal RD. The write command signal WT may be enabled for a write operation, and the read command signal RD may be enabled for a read operation. The command signal CMD may include multiple bits, and a logic level combination of the multiple bits included in the command signal CMD for enabling the write command signal WT or the read command signal RD may be set to be different according to embodiments.

The buffer control circuit 82 may generate a buffer enablement signal BUF_EN in response to the write command signal WT and the read command signal RD. The buffer control circuit 82 may generate the buffer enablement signal BUF_EN, which is enabled if the write command signal WT is enabled for a write operation and is disabled if the read command signal RD is enabled for a read operation. The buffer control circuit 82 may generate the buffer enablement signal BUF_EN, which is enabled during the write operation and is disabled during the read operation.

The clock buffer 83 may receive the first clock signal CLK_t and the second clock signal CLK_c through the second pad 71 and the third pad 72 and may buffer the first clock signal CLK_t and the second clock signal CLK_c to output the buffered signals as a first internal clock signal ICLK1 and a the second internal clock signal ICLK2. The first internal clock signal ICLK1 and the second internal clock signal ICLK2 may have opposite phases.

The strobe signal buffer 84 may receive the first data strobe signal DQS_t and the second data strobe signal DQS_c through the fourth pad 73 and the fifth pad 74 in response to the buffer enablement signal BUF_EN. For example, the strobe signal buffer 84 may buffer the first data strobe signal DQS_t and the second data strobe signal DQS_c while the buffer enablement signal BUF_EN is enabled, thereby outputting a buffer output signal B_OUT and an inverted buffer output signal B_OUTB.

The strobe signal division circuit 85 may divide the buffer output signal B_OUT and the inverted buffer output signal B_OUTB to generate a first internal strobe signal IDQS, a second internal strobe signal QDQS, a third internal strobe signal IDQSB, and a fourth internal strobe signal QDQSB.

The first internal strobe signal IDQS, the second internal strobe signal QDQS, the third internal strobe signal IDQSB, and the fourth internal strobe signal QDQSB may have a cycle time that is twice a cycle time of the first data strobe signal DQS_t and the second data strobe signal DQS_c. The first internal strobe signal IDQS and the third internal strobe signal IDQSB have 180-degree phase difference, and the second internal strobe signal QDQS and the fourth internal strobe signal QDQSB may have 180-degree phase difference.

The section signal generation circuit 86 may generate a section signal PDSB in response to the first internal strobe signal IDQS, the first internal clock signal ICLK1, and the second internal clock signal ICLK2. For example, the section signal generation circuit 86 may store the first internal clock signal ICLK1 and the second internal clock signal ICLK2 in synchronization with the first internal strobe signal IDQS to generate the section signal PDSB which is enabled while the first data strobe signal DQS_t and the second data strobe signal DQS_c do not toggle. In some embodiments, the section signal generation circuit 86 may be realized to store the first internal clock signal ICLK1 and the second internal clock signal ICLK2 in synchronization with at least one of the first to fourth internal strobe signals IDQS, QDQS, IDQSB and QDQSB.

The drive control signal generation circuit 87 may generate a drive control signal PU_CNT in response to the buffer enablement signal BUF_EN, the section signal PDSB, and the buffer output signal B_OUT. The drive control signal generation circuit 87 may generate the drive control signal PU_CNT which is enabled during a predetermined initial section of time in synchronization with a point of time when the buffer enablement signal BUF_EN is enabled. The drive control signal generation circuit 87 may generate the drive control signal PU_CNT, which is disabled in response to the buffer output signal B_OUT and is enabled while the section signal PDSB is enabled.

The drive control circuit 88 may drive a node nd61 coupled to the fourth pad 73 and a node nd62 coupled to the fifth pad 74 to a predetermined logic level in response to the drive control signal PU_CNT. Here, the node nd62 may determine a logic level of the buffer output signal B_OUT. For example, the drive control circuit 88 may drive the node nd61 to a logic high level if the drive control signal PU_CNT is enabled (e.g., the drive control circuit 88 may shift a logic level of the buffer output signal B_OUT to the logic high level) and may drive the node nd61 to a logic low level if the drive control signal PU_CNT is disabled.

The data receiver 89 may receive the data signal DQ through the sixth pad 75 and may store the data signal DQ in synchronization with the first internal strobe signal IDQS, the second internal strobe signal QDQS, the third internal strobe signal IDQSB, and the fourth internal strobe signal QDQSB to generate an internal data signal DIN.

Figure 10:
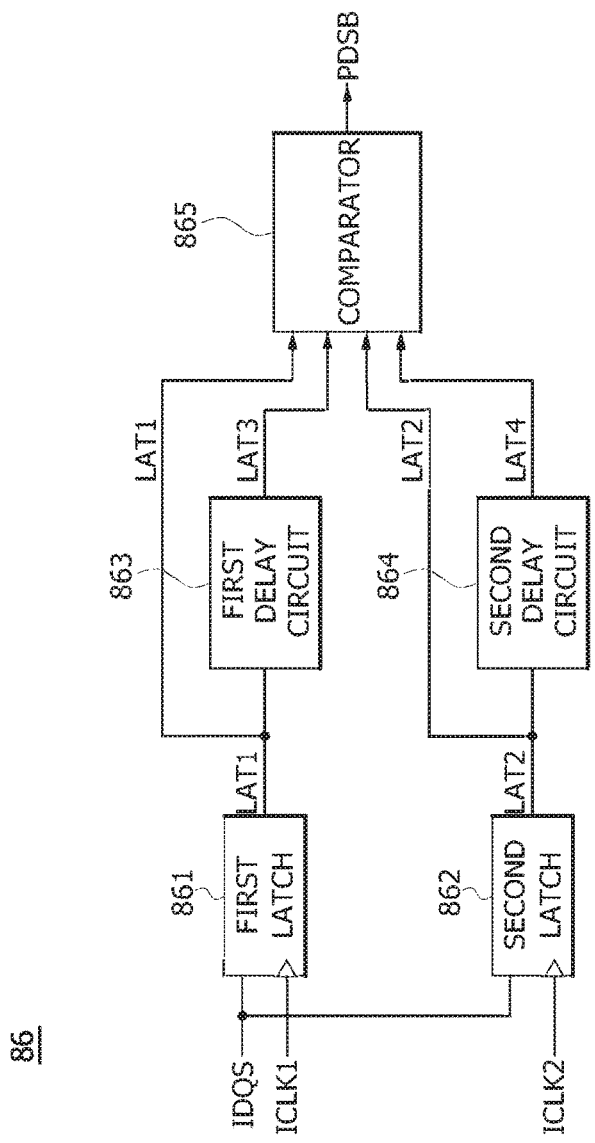
FIG. 10 is a diagram of a section signal generation circuit included in the semiconductor system of FIG. 9.

Referring to FIG. 10, the section signal generation circuit 86 may include a first storage circuit 861, a second storage circuit 862, a first delay circuit 863, a second delay circuit 864, and a comparator 865.

The first storage circuit 861 may store the first internal strobe signal IDQS to generate a first storage circuit output signal LAT1 in synchronization with the first internal clock signal ICLK1. For example, the first storage circuit 861 may store the first internal strobe signal IDQS to output the stored signal as the first storage circuit output signal LAT1 in synchronization with a rising edge of the first internal clock signal ICLK1.

The second storage circuit 862 may store the first internal strobe signal IDQS to generate a second storage circuit output signal LAT2 in synchronization with the second internal clock signal ICLK2. For example, the second storage circuit 862 may store the first internal strobe signal IDQS to output the stored signal as the second storage circuit output signal LAT2 in synchronization with a rising edge of the second internal clock signal ICLK2.

The first delay circuit 863 may delay the first storage circuit output signal LAT1 by a first delay time to generate a third storage circuit output signal LAT3. In an embodiment, the first delay time may be set to be a cycle time of the first internal clock signal ICLK1.

The second delay circuit 864 may delay the second storage circuit output signal LAT2 by a second delay time to generate a fourth storage circuit output signal LAT4. In an embodiment, the second delay time may be set to be a cycle time of the first internal clock signal ICLK1.

The comparator 865 may generate the section signal PDSB in response to the first storage circuit output signal LAT1, the second storage circuit output signal LAT2, the third storage circuit output signal LAT3, and the fourth storage circuit output signal LAT4. The comparator 865 may generate the section signal PDSB enabled to have a logic low level if the first storage circuit output signal LAT1, the second storage circuit output signal LAT2, the third storage circuit output signal LAT3, and the fourth storage circuit output signal LAT4 have the same logic level as one another. The comparator 865 may generate the section signal PDSB disabled to have a logic high level if the first storage circuit output signal LAT1, the second storage circuit output signal LAT2, the third storage circuit output signal LAT3, and the fourth storage circuit output signal LAT4 do not have the same logic level as one another.

The write operation performed by the semiconductor system in accordance with an embodiment will be described hereinafter with reference to FIG. 11.

If the write operation starts, the buffer output signal B_OUT may be driven to a logic high level during a predetermined initial section by the buffer enablement signal BUF_EN which is enabled. After the initial section of time terminates, an operation of driving the buffer output signal B_OUT to a logic high level may terminate. Thereafter, if the write operation terminates, the buffer output signal B_OUT may be driven to a logic high level again by the section signal PDSB enabled to have a logic low level.

Figure 11:
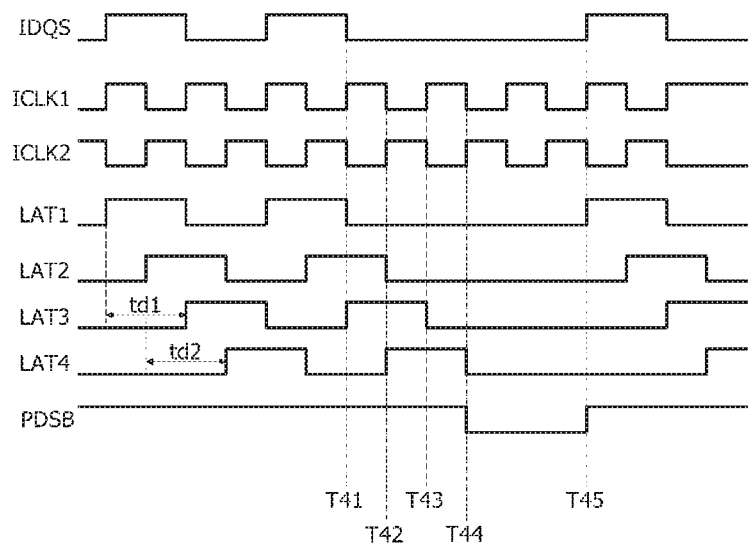
FIG. 11 is a timing diagram illustrating an example operation of the semiconductor system shown in FIGS. 9 and 10.

Referring to FIG. 11, waveforms of the first internal clock signal ICLK1 and the second internal clock signal ICLK2 which are generated by buffering the first clock signal CLK_t and the second clock signal CLK_c and waveforms of the first to fourth storage circuit output signals LAT1, LAT2, LAT3 and LAT4 which are generated by storing the first internal strobe signal IDQS in synchronization with the first internal clock signal ICLK1 and the second internal clock signal ICLK2 may be provided. The third storage circuit output signal LAT3 may be generated by delaying the first storage circuit output signal LAT1 by a first delay time td1, and the fourth storage circuit output signal LAT4 may be generated by delaying the second storage circuit output signal LAT2 by a second delay time td2.

Referring again to FIG. 11, a section of time in which the section signal PDSB is enabled to have a logic low level after the write operation may be provided. That is, if toggling of the first internal strobe signal IDQS terminates at a point of time T41 after the write operation, a logic level of the first storage circuit output signal LAT1 may be changed from a logic high level into a logic low level at the point of time T41 and a logic level of the second storage circuit output signal LAT2 may be changed from a logic high level into a logic low level at a point of time T42. In addition, a logic level of the third storage circuit output signal LAT3 may be changed from a logic high level into a logic low level at a point of time T43, and a logic level of the fourth storage circuit output signal LAT4 may be changed from a logic high level into a logic low level at a point of time T44. Hence, all of the first to fourth storage circuit output signals LAT1, LAT2, LAT3 and LAT4 may have the same logic level (i.e., a logic low level) after the point of time T44, the section signal PDSB may be enabled to a logic low level. Thereafter, if the write operation starts, the first internal strobe signal IDQS may start to toggle from a point of time T45, and a level of the first storage circuit output signal LAT1 may be changed from a logic low level into a logic high level at the point of time T45. Accordingly, the section signal PDSB may be disabled to have a logic high level at the point of time T45.

In summary, the semiconductor system according to an embodiment may drive the buffer output signal B_OUT to a logic high level during the initial section of time from a point of time when the write operation starts in order not to generate the first to fourth internal strobe signals IDQS, QDQS, IDQSB and QDQSB that are abnormal due to the first and second data strobe signals DQS_t and DQS_c that do not toggle. If the buffer output signal B_OUT is continuously driven to a logic high level while the write operation is performed, the first internal strobe signal IDQS, the second internal strobe signal QDQS, the third internal strobe signal IDQSB, and the fourth internal strobe signal QDQSB may not be normally generated by the first data strobe signal DQS_t and the second data strobe signal DQS_c. In such a case, a data input and output section of time may be reduced. Hence, the semiconductor system according to an embodiment may prevent a data input and output section of time from being reduced by terminating a driving of the buffer output signal B_OUT to a logic high level while the write operation is performed after the initial section of time terminates. In addition, if the write operation terminates, the semiconductor system according to an embodiment may drive the buffer output signal B_OUT to a logic high level to set a state in which the first data strobe signal DQS_t and the second data strobe signal DQS_c are stably inputted. In a read operation, an operation of generating the first internal strobe signal IDQS, the second internal strobe signal QDQS, the third internal strobe signal IDQSB, and the fourth internal strobe signal QDQSB from the first data strobe signal DQS_t and the second data strobe signal DQS_c may not be required. Thus, the semiconductor system according to an embodiment may terminate the driving of the buffer output signal B_OUT in order to reduce current consumption when the read operation is performed.

Figure 12:
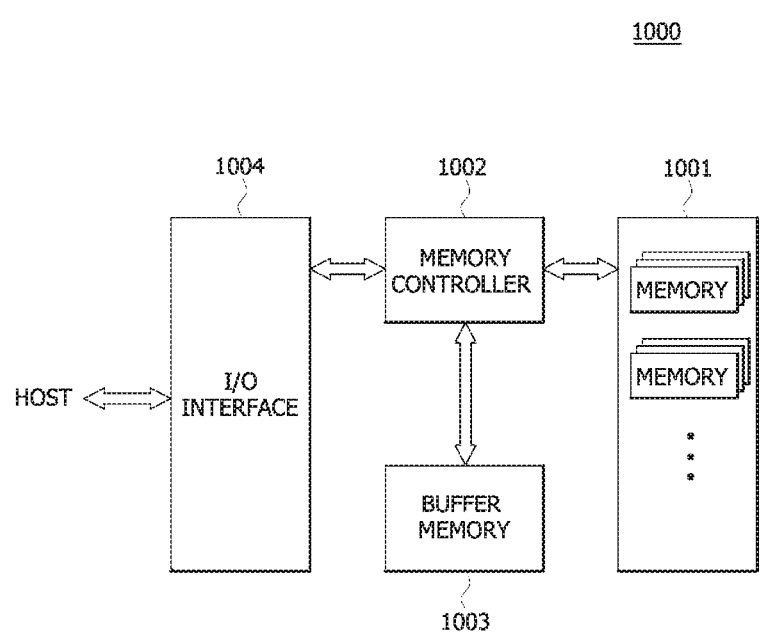
FIG. 12 is a diagram illustrating an example configuration of an electronic system employing the semiconductor device or the semiconductor system shown in FIG. 1 to FIG. 11.

The second semiconductor device or the semiconductor system described with reference to FIGS. 1 to 11 may be applied to an electronic system that includes a memory system, a graphic system, a computing system, a mobile system, or the like. For example, as illustrated in FIG. 12, an electronic system 1000 according an embodiment may include a data storage circuit 1001, a memory controller 1002, a buffer memory 1003, and an input/output (I/O) interface 1004.

The data storage circuit 1001 may store data outputted from the memory controller 1002 or may read the stored data and output the data to the memory controller 1002 according to a control signal generated from the memory controller 1002. The data storage circuit 1001 may include the second semiconductor device 2 illustrated in FIG. 1 or the second semiconductor device 6 illustrated in FIG. 9. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may include the first semiconductor device 1 illustrated in FIG. 1 or the first semiconductor device 5 illustrated in FIG. 9. Although FIG. 12 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data outputted from or to be inputted to the data storage circuit 1001. The buffer memory 1003 may store the data, which are outputted from the memory controller 1002, according to a control signal. The buffer memory 1003 may read the stored data and output the data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data applied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
   a strobe signal buffer configured to buffer a first data strobe signal and a second data strobe signal to generate a buffer output signal and an inverted buffer output signal;
   a strobe signal division circuit configured to divide the buffer output signal and the inverted buffer output signal to generate internal strobe signals which are used in capturing data when receiving data; and
   a drive control circuit configured to drive the buffer output signal to a predetermined logic level during an initial section of time from a point of time when a write operation is performed.

2. The device of claim 1, wherein the initial section of time is set to be a pulse width of a pulse that is generated in response to a write command signal enabled for the write operation.

3. The device of claim 1, wherein the drive control circuit terminates a driving of the buffer output signal while the write operation is performed after the initial section of time terminates.

4. The device of claim 1, wherein the drive control circuit drives the buffer output signal to a predetermined logic level in synchronization with a point of time when the write operation terminates.

5. The device of claim 1, wherein the drive control circuit controls a driving of the buffer output signal in response to a drive control signal.

6. The device of claim 5, wherein the drive control signal is enabled during the initial section of time from a point of time when the write operation starts, is disabled during the write operation after the initial section of time terminates, and is enabled in synchronization with a point of time when the write operation terminates.

7. The device of claim 5, further comprising a drive control signal generation circuit configured to generate the drive control signal in response to a buffer enablement signal and a section signal,
   wherein the buffer enablement signal is enabled at a point of time when the write operation is performed, and
   wherein the section signal is enabled while the first data strobe signal and the second data strobe signal do not toggle.

8. The device of claim 7, wherein the drive control signal generation circuit includes:
   a first drive circuit configured to drive an internal node in response to the buffer enablement signal;
   a second drive circuit configured to drive the internal node in response to the buffer enablement signal and the section signal; and
   a third drive circuit configured to drive the internal node in response to the buffer output signal.

9. The device of claim 8, wherein the first drive circuit includes:
   a pulse generator configured to generate a pulse in response to the buffer enablement signal; and
   a pull-up element configured to pull up the internal node in response to the pulse.

10. The device of claim 8, wherein the second drive circuit pulls up the internal node if the buffer enablement signal and the section signal are enabled.

11. The device of claim 10, wherein the second drive circuit includes a transfer gate configured to control an input of the section signal in response to the buffer output signal.

12. The device of claim 8, wherein the third drive circuit pulls down the internal node if the buffer output signal is driven to the predetermined logic level.

13. The device of claim 8, wherein the drive control signal generation circuit further includes a fourth drive circuit configured to pulls down the internal node if a read operation is performed.

14. The device of claim 7, further comprising a section signal generation circuit configured to store an internal strobe signal to generate the section signal in synchronization with first to fourth internal clock signals which are generated by dividing a first clock signal and a second clock signal.

15. The device of claim 14, wherein the section signal generation circuit includes:
   a first storage circuit configured to store the internal strobe signal to generate a first storage circuit output signal in synchronization with the first internal clock signal;
   a second storage circuit configured to store the internal strobe signal to generate a second storage circuit output signal in synchronization with the second internal clock signal;
   a third storage circuit configured to store the internal strobe signal to generate a third storage circuit output signal in synchronization with the third internal clock signal;
   a fourth storage circuit configured to store the internal strobe signal to generate a fourth storage circuit output signal in synchronization with the fourth internal clock signal; and
   a comparator configured to generate the section signal in response to the first to fourth storage circuit output signals.

16. The device of claim 15, wherein the comparator generates the section signal which is enabled if all of the first to fourth storage circuit output signals have the same logic level.

17. The device of claim 7, further comprising a section signal generation circuit configured to store an internal strobe signal to generate the section signal in synchronization with first and second internal clock signals which are generated by buffering first and second clock signals.

18. The device of claim 17, wherein the section signal generation circuit includes:
   a first storage circuit configured to store the internal strobe signal to generate a first storage circuit output signal in synchronization with the first internal clock signal;
   a second storage circuit configured to store the internal strobe signal to generate a second storage circuit output signal in synchronization with the second internal clock signal;
   a first delay circuit configured to delay the first storage circuit output signal by a first delay time to generate a third storage circuit output signal;
   a second delay circuit configured to delay the second storage circuit output signal by a second delay time to generate a fourth storage circuit output signal; and
   a comparator configured to generate the section signal in response to the first to fourth storage circuit output signals.

19. A semiconductor system comprising:
   a first semiconductor device configured to output a command signal, a first clock signal, a second clock signal, a first data strobe signal, a second data strobe signal, and a data signal; and
   a second semiconductor device configured to buffer the first data strobe signal and the second data strobe signal to generate a buffer output signal and an inverted buffer output signal and configured to divide the buffer output signal and the inverted buffer output signal to generate internal strobe signals which are used in capturing data when receiving data, wherein the buffer output signal is driven to a predetermined logic level in response to the command signal during an initial section from a point of time when a write operation starts.

20. The system of claim 19, wherein the initial section of time is set to be a pulse width of a pulse that is generated in response to a write command signal enabled for the write operation.

21. The system of claim 19, wherein the second semiconductor device terminates a driving of the buffer output signal while the write operation is performed after the initial section terminates.

22. The system of claim 19, wherein the second semiconductor device drives the buffer output signal to a predetermined logic level in synchronization with a point of time when the write operation terminates.

23. The system of claim 19, wherein the second semiconductor device controls a driving of the buffer output signal in response to a drive control signal.

24. The system of claim 23, wherein the drive control signal is enabled during the initial section of time from a point of time when the write operation starts, is disabled during the write operation after the initial section of time terminates, and is enabled in synchronization with a point of time when the write operation terminates.

25. The system of claim 23,
wherein the drive control signal is generated in response to a buffer enablement signal and a section signal,
wherein the buffer enablement signal is enabled at a point of time when the write operation is performed, and
wherein the section signal is enabled while the first data strobe signal and the second data strobe signal do not toggle.

26. The system of claim 25, wherein the second semiconductor device includes:
a first drive circuit configured to drive an internal node in response to the buffer enablement signal;
a second drive circuit configured to drive the internal node in response to the buffer enablement signal and the section signal; and
a third drive circuit configured to drive the internal node in response to the buffer output signal.

27. The system of claim 26, wherein the second semiconductor device further includes a fourth drive circuit configured to pull down the internal node if a read operation is performed.

28. The system of claim 25, wherein the second semiconductor device stores an internal strobe signal to generate the section signal in synchronization with first to fourth internal clock signals which are generated by dividing a first clock signal and a second clock signal.

29. The system of claim 25, wherein the second semiconductor device stores an internal strobe signal to generate the section signal in synchronization with first and second internal clock signals which are generated by buffering first and second clock signals.

* * * * *